(12) United States Patent
Maddiotto et al.

(10) Patent No.: US 6,690,735 B1
(45) Date of Patent: Feb. 10, 2004

(54) BROAD BAND DIGITAL RADIO RECEIVER FOR MULTICARRIER SIGNAL

(75) Inventors: Massimo Maddiotto, Verano Brianza (IT); Marco Politi, Milan (IT)

(73) Assignee: Siemens Information and Communication Networks, S.p.A., Milan (IT)

( * ) Notice: Subject to any disclaimer, the term of this patent is extended or adjusted under 35 U.S.C. 154(b) by 0 days.

(21) Appl. No.: 09/508,198

(22) PCT Filed: Sep. 10, 1998

(86) PCT No.: PCT/EP98/05749

§ 371 (c)(1),
(2), (4) Date: Apr. 24, 2000

(87) PCT Pub. No.: WO99/14863

PCT Pub. Date: Mar. 25, 1999

(30) Foreign Application Priority Data

Sep. 15, 1997 (IT) .......................................... MI97A2086

(51) Int. Cl.[7] .......................... H04L 27/28; H04L 27/06; H04L 27/14; H04L 27/22; H03K 9/00
(52) U.S. Cl. ........................ 375/260; 375/346; 375/350; 375/316
(58) Field of Search ................................. 375/343, 377, 375/316, 222, 346, 260; 370/210, 342, 335; 348/472; 455/69

(56) References Cited

U.S. PATENT DOCUMENTS 6,088,406 A * 7/2000 Suzuki ........................ 375/343

FOREIGN PATENT DOCUMENTS

| EP | A2656701 | 6/1995 |
| WO | A9402996 | 2/1994 |
| WO | A1-9512261 | 5/1995 |

* cited by examiner

*Primary Examiner*—Stephen Chin
*Assistant Examiner*—Curtis Odom
(74) *Attorney, Agent, or Firm*—Birch, Stewart, Kolasch & Birch, LLP

(57) ABSTRACT

A broad band digital radio receiver for multicarrier signals employs a quadrature demodulator to directly shift the radiofrequency signal in a base band. A local oscillator has frequency $f_0$ placed at the center of the radiofrequency BW band, so channel pairs, symmetric versus $f_0$, are superimposed in the lower base half-band. Base band equivocation is then solved by numeric-type second orthogonal demodulators, which supply pairs of twice-demodulated signals that can be grouped in four equation systems in four unknown values consisting of in-phase and quadrature components of the two channels of each pair. Subsequent reconstruction networks solve the relevant systems and give the two components of each single channel for each pair. One network in the receiver measures amplitude and phase dissymmetries in the two branches of the analog demodulator and supplies four corresponding digital coefficients to the reconstruction network, which can then counterbalance at output the effects of dissymmetry.

16 Claims, 5 Drawing Sheets

BROAD BAND DIGITAL RADIO RECEIVER FOR MULTICARRIER SIGNAL

CROSS-REFERENCE TO RELATED APPLICATIONS

This application is the national phase under 35 U.S.C. §371 of PCT International Application No. PCT/EP98/05749 which has an International filing date of Sep. 10, 1998, which designated the United States of America. This application claims the benefit of priority under 35 U.S.C. §119 of Application No. MI97A002086, filed Sep. 15, 1997, in Italy, the disclosure of which is hereby incorporated by reference.

BACKGROUND OF THE INVENTION

1. Field of the Invention

The present invention relates to the field of the technique concerning professional telecommunication systems, and more in particular, to a broad band digital radio receiver for multicarrier signals.

The use of the radiofrequency spectrum in telecommunication is governed by international standards assigning specific frequency bands to given services, either public or private. Inside these bands services are generally organized in order to exploit the band occupation at best, for instance, subdividing the same into a plurality of contiguous channels. A number of examples are available on this matter. A first example is represented by telephone radio links, where thousands of telephone channels are multiplexed among them, either in frequency or in time, in order to give a result contiguous within a microwave band. A second example is the Paneuropean telephone system, hereinafter referred to through the acronym GSM (Groupe Special Mobile), based on the time division use of even 174 carriers, 200 KHz spaced among them, modulated according to a GMSK scheme (Gaussian Minimum Shift Keying), and individually transmitted within a 35 MHz band, positioned around 900 MHz (EGSM). Reference to the GSM system is purposely made since, being the same as an essentially digital system, it results a preferred field of application according to the subject invention. The digital receiver definition means that it is designed to receive signals for which the parameter, or parameters, characterizing the modulated carriers, assume a discrete number of values; in the GSM, as in the most modern telecommunication systems, the carriers are modulated in an orthogonal way, starting from a modulating signal consisting of bursts of information or synchronization bits.

A problem arising in the modern transceivers is in fact that of the conversion of the reception analog signal into a digital format, from which the original burst has to be obtained through appropriate processing with the DSP techniques (Digital Signal Processing). The classical implementation scheme of radio receivers operating in the field of the present invention foresees at least an intermediate frequency conversion stage, followed by a demodulator and an analog-to-digital converter (A/D) of the demodulated signal. The reasons inducing to the intermediate frequency conversion of the signal received are multiple, among which the main one is undoubtedly that of an improved and more easy selectivity of the receiver. Of course, the conversion to filter the signal falling in a so-called "image" band at radio frequency is a speculation compared to one versus the frequency $f_{ol}$ of the local oscillator governing the intermediate frequency converter. Such a filtering is generally very complex, due to the close distance usually present among adjacent radio channels. A second problem arising, is the conversion speed of the A/D converter, since it depends on the bandwidth of the signal to be processed. The above mentioned speed corresponds to the sampling frequency $f_s$ of a sampler of the analog signal preceding the A/D converter. The frequency $f_s$ must be equal to at least the double of the maximum frequency included in the BW band of the signal to be converted, as defined by the Nyquist proposition, which represents a non negligible burden in the case of broad band signals, just like multicarrier ones.

2. Background Art

In order to double the band to be processed by the A/D converter, a functional diagram is shown in FIG. 1 of a multicarrier receiver, simplified for description sake, to the case of only two carriers representing two adjacent channels in a comprising BW band. The receiver of FIG. 1 is enabled to halve the sampling frequency $f_s$ and can be obtained through the sole application of the conventional knowledge of the skilled in the art.

Referring first to FIG. 1, a radiofrequency stage including a low-noise amplifier RFAMP for a RF input signal consisting of two carriers having $f_{c1}$ and $f_{c2}$ frequency, respectively, is orthogonally modulated by the information conveyed by the relevant channels CH1 and CH2 associated to the same. The signal coming out from RFAMP is equally shared over two branches leading to the input of two relevant band pass filters PBAND1 and PBAND2 having width BW/2, sharing the whole RF band. The signals coming out from the filters reach two first inputs of relevant mixers MIX1 and MIX2, the second inputs of which are reached by two sinusoidal signals of local oscillator, respectively, having $f_{ol1}=f_{c1}-BW/4$ and $f_{ol2}=f_{c2}-vBW/4$ frequencies. Thanks to the particular values of $f_{ol1}$ and $f_{ol2}$, the two channels CH1 and CH2 are included in the 0 to BW/2 band. The signals are filtered by two low-pass filters, not shown in the figure, eliminating the $2f_{ol1}$ and $2f_{ol2}$ components reaching two A/D blocks operating at $f_s=BW$ frequency. The digital signals coming out from the A/D blocks reach two DDC blocks representing some numeric demodulators in quadrature. For the detail of these blocks, reference will be made to the description of the following figures. The in phase component I1 and the in quadrature component Q1 of the demodulated signal concerning channel CH1 are present at the two outputs of block DDC1 likewise the in phase component I2 and the in quadrature component Q2 of the demodulated signal concerning channel CH2 are present at the two outputs of block DDC2. The above-mentioned components are sent to a detector block, not shown in the figure, giving back the starting information. The diagram of FIG. 1 can be extended to a receiver for more than two channels, simply adding as much DDC blocks as are the new channels.

As it can be noticed from the previous description, in the receiver of FIG. 1 the A/D converters operate at halved speed compared to those used in the receivers mentioned above. However, this advantage versus the background art is soon made vain by the cost of the two high selectivity, radiofrequency filters PBAND1 and PBAND2 and by the need to equip two local oscillators.

OBJECTS OF THE INVENTION

Object of the present invention is to overcome the drawbacks of the background art and of the receiver of FIG. 1, and to indicate a method for the implementation of a broad band radio receiver for multicarrier signals with orthogonal modulation.

SUMMARY OF THE INVENTION

The above object is solved by the present invention which is addressed to a method for the implementation of a broad band receiver for a signal (z1(t)) consisting of a plurality of equispaced carriers, orthogonally modulated by information conveyed by relevant channels in order to carry out a radiofrequency multicarrier signal, the method comprising in sequence the following steps:

(a) direct demodulation (DEMI/Q) of the radiofrequency filtered signal (z1'(t)) by multiplication of the signal for two local phase quadrature carriers ($\cos\omega_0 t$, $-\sin\omega_0 t$), whose frequency corresponds to a central value of the radiofrequency multicarrier signal spectrum, obtaining a demodulated signal having a relevant spectrum in the lower half of the base band (BW) where pairs of channels (CH4, CH5; . . . ; CH1, CH8) in symmetric positions at the two sides of the local phase quadrature carriers are superimposed;

(b) broad band filtering in base band in phase component (z2'(t)) and in quadrature component (z3'(t)) that correspond to the demodulated signal for the suppression of additional components outside an interest band;

(c) sampling of the components broad band filtered in base band (z2'(t)), making use of a sampling frequency equal to the bandwidth (BW) of the multicarrier signal, and subsequent analog-to-digital conversion (A/D) of the sampled components, obtaining first digital in phase and quadrature components;

(d) digital demodulation (DEM4, DEM5; . . . ; DEM1, DEM8) of the first digital components by multiplication for pairs of relevant phase quadrature sinusoidal digital signals having a frequency equal to the value of a center band of pairs of channels (CH4, CH5; . . . ; CH1, CH8) previuosly superimposed in step (a), obtaining in coincidence with the pairs of phase quadrature sinusoidal digital signals due to multiplication, quartets of numeric values ($z4'(t)_{4/5}$, $z5'(t)_{4/5}$, $z6'(t)_{4/5}$, $z7'(t)_{4/5}$; . . . ; $z4'(T)_{1/8}$, $z5'(t)_{1/8}$, $z6'(t)_{1/8}$, $z7'(t)_{1/8}$) that can be analytically expressed through linear systems, each of four equations in four unknown values corresponding to amplitudes of second digital in phase (I4, I5; . . . ; I1, I8) and in quadrature (Q4, Q5; . . . ; Q1, Q8) components belonging to the quartets of numeric values;

(e) solution of the linear systems (RSOM) obtaining the above-mentioned components (I4, Q4; I5, Q5; . . . ; I1, Q1; I8 Q8), with each single channel of the pairs of channels, thus eliminating a phase and amplitude dyssymmetry in base band due to the superimposition of channels in step (a).

An additional object of the invention is a radio receiver implemented according to the above mentioned process. The receiver employs A/D converters operating at halved speed, like what previously described referring to the background art mentioned first. However, compared to the receiver of FIG. 1 it employs only one radiofrequency local oscillator and one sole radiofrequency band pass filter having not too high selectivity, since the problem to filter the image band does not exist, compared to the two high selectivity filters and the two local oscillators required to implement the above mentioned solution of the known type. The economy is lightly penalized by the addition of N/2 numeric networks for the reconstruction of the in phase and in quadrature components of the single demodulated channels of each pair of channels that resulted superimposed in base band. As it can be noticed, in the receiver according to present invention, the most expensive analog portion is reduced to the minimum necessary extent, in favor of the digital portion, simpler, reliable and less expensive.

The receiver object of the present invention is able to correctly operate and to show the advantages listed above, provided that the electrical behavior of the mixers inserted in the two branches in quadrature of the analog demodulator result perfectly symmetric. In the contrary instance, undesired components would be originated in the demodulated signal, which would prevent the network that eliminates the equivocation in base band to obtain the original values of the in phase and in quadrature components of the demodulated carriers. Incidentally, the receiver includes second demodulators with numeric mixers not introducing any unbalancing. The mentioned inconvenience can be overcome selecting for the analog demodulator a couple of mixers, simultaneously obtained in a same manufacturing procedure, with high coupling degree of the physical parameters, assured by the manufacturer.

Would this not be enough, it is however possible to modify the receiver according to a modified process particularly useful in case of multicarrier signals for channels subject to a wide level dynamic, such as for instance the signals used in the mobile communication systems. The variant differs from the main process due to the fact that the broad band filtering of the demodulated signal is a band pass filtering suppressing from the spectrum of the signal in base band the components in a condition of null frequency and that introduces the following additional steps completely independent from the main sequence:

measurement of the amplitude and phase dissymmetry degree on the two branches of an analog demodulator performing the direct demodulation from radiofrequency in base band, obtaining correction factors;

introduction of the correction factors in the linear systems of equations, obtaining still linear modified systems having the same number of equations;

solution of the modified systems, obtaining for each single channel of the pairs the above-mentioned components in phase and in quadrature, without unbalancing otherwise due to the dissymmetries on the two branches of the analog demodulator, further comprising the steps of:

measuring the amplitude and phase dissymmetry degree on two branches of an analog demodulator (DEMI/Q) performing said direct demodulation from radiofrequency to base band;

introducing four correction factors (a, b, c, d), which depend on the preceding measurement, in said linear systems of equations, obtaining modified systems, still linear, having the same number of equations;

solving said modified systems (RSCOR), in corresponding quartets of numeric values ($z4'(t)_{4/5}$, $z5'(t)_{4/5}$, $z6'(t)_{4/5}$, $z7'(t)_{4/5}$; . . . ; $z4'(t)_{1/8}$, $z5'(t)_{1/8}$, $z6'(t)_{1/8}$, $z7'(t)_{1/8}$) modified unknown amplitudes of the second digital in phase and in quadrature components, without unbalancing distortion, otherwise due to said dissymmetries on the two branches of said analog demodulator.

BRIEF DESCRIPTION OF DRAWINGS

Additional objects and advantages of the present invention may be understood making reference to the detailed description of an embodiment of the same, taken in conjunction with the attached drawings, in which.

DETAILED DESCRIPTION

The embodiment that will now be described in detail concerns a simplified radio receiver for the case of signals with two sole modulated carrier. However, the conclusions obtained can be directly extended to the more general case of receiver for N>2 carriers, which better qualify the invention. This last receiver will be shown in any case and its description will result after a description of the simplified receiver.

Figure 1:
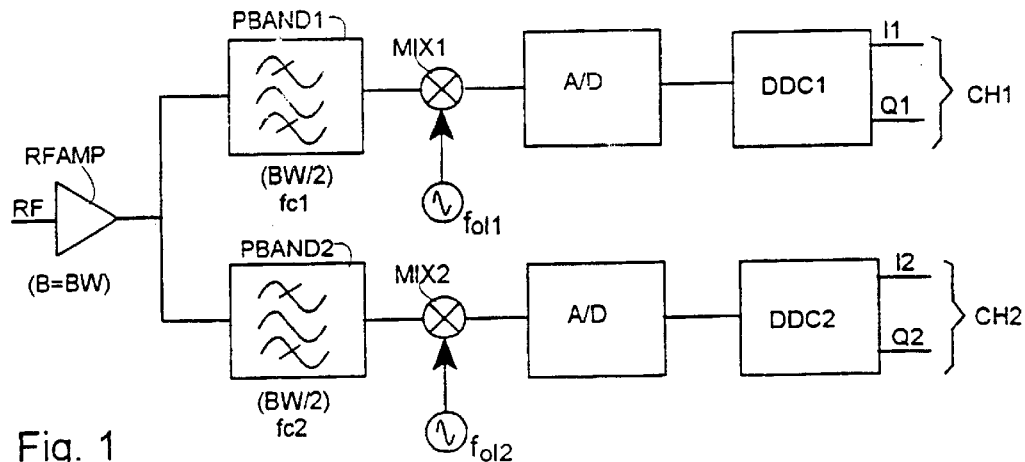
FIG. 1 shows a functional diagram of a multicarrier receiver.
Figure 2:
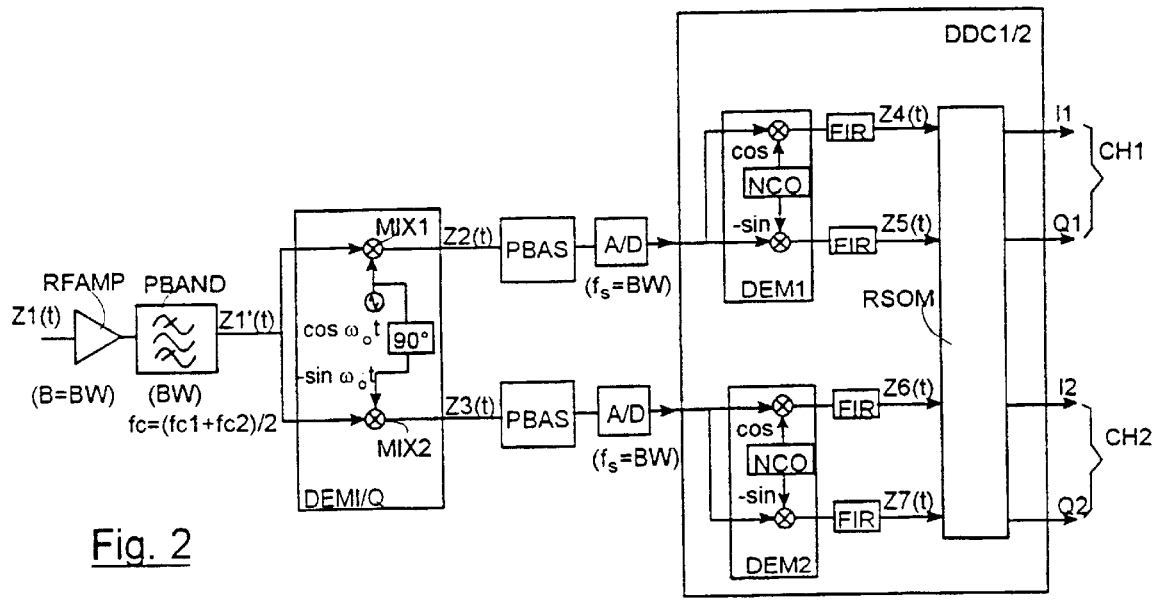
FIG. 2 shows a general block diagram of the receiver according to present invention, for the case simplified to two carriers only.

Referring to FIG. 2, a receiver for an incoming radio signal radio z1(t) is shown consisting of two carriers, having $f_{c1}$ and $f_{c2}$ frequency, respectively, orthogonally modulated by the information conveyed by relevant channels CH1 and CH2 associated to the same. The signal z1(t) reaches the input of a low-noise radiofrequency amplifier RFAMP, and is sent to a band pass filter PBAND, with BW bandwidth higher than or equal to the total band of the two adjacent channels CH1 and CH2, and a center frequency $f_c=(f_{c1}+f_{c2})/2$. Downstream from the PBAND filter a quadrature demodulator DEMI/Q is placed, including two mixers MIX1 and MIX2 the first inputs of which are reached by the signal z1'(t) coming out from the filter PBAND, equally shared, and the second inputs of which are reached by relevant sinusoidal signals having frequency $f_0=f_c$. More particularly, the second input of MIX1 is reached by a signal $\cos\omega_0 t$ generated by a local oscillator, while the second input of MIX2 is reached by a signal $-\sin\omega_0 t$, obtained from the previous signal through a 90° phase shifting circuit. The outputs of MIX1 and MIX2, a phase signal z2(t) and a quadrature z3(t) one respectively, are connected to the input of two relevant identical low-pass filters PBAS and therefore to the input of two A/D blocks including a sampler operating at $f_s$=BW frequency including an analog/digital converter. The outputs of the two A/D blocks are connected to two relevant inputs of a block DDC1/2 including two identical demodulators in quadrature DEM1 and DEM2, differing from DEMI/Q for being of the digital type and for the different frequency of a numeric oscillator NCO driving the comprised numeric mixers. A first input of DDC1/2 for the signal in phase z2(t), digitalized, is connected to the inputs of the demodulator DEM1, while the second input of DDC1/2 for the signal in quadrature z3(t), digitalized, is connected to the inputs of the demodulator DEM2. At the outputs in phase and in quadrature of DEM1 two signals z4(t) and z5(t) are respectively present, while at the outputs in phase and in quadrature of DEM2 two signals z6(t) and z7(t) are respectively present. The block DDC1/2 also includes four identical low-pass filters of the FIR type comprised in the four branches starting from the two pairs of outputs of the demodulators DEM1 and DEM2. The outputs of the four filters FIR are connected to a same number of inputs of a block RSOM, at the four outputs of which the in phase and in quadrature components are present, indicated with I1 and Q1 respectively, of the demodulated signal belonging to channel CH1, and the in phase and in quadrature components, indicated with I2 and Q2, respectively, of the demodulated signal belonging to the channel CH2.

Figure 4:
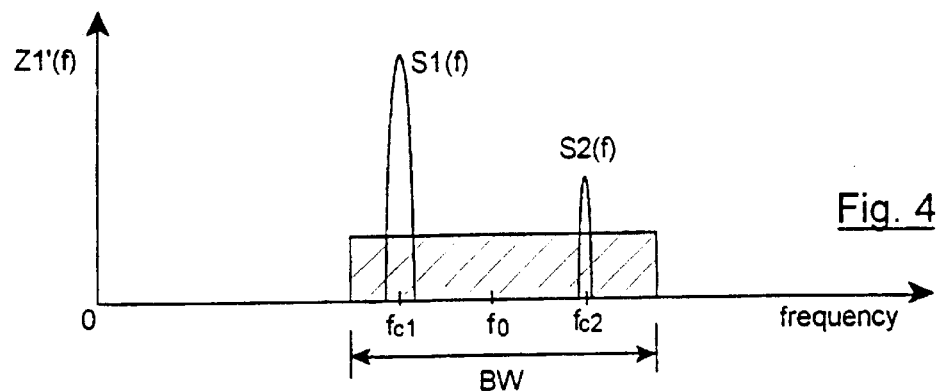
FIGS. 4 and 5 represent the spectrum of the waveforms relevant to the operation of the receivers shown in FIGS. 2 and 3.

FIG. 4 shows a spectral representation Z1'(f) of the z1'(t) signal consisting of the sum of two modulated signals s1(t) and s2(t) concerning the two radiofrequency channels CH1 and CH2 entering the receiver. The spectrum Z1'(f) globally occupies a band of BW width and comprises two spectrum S1(f) and S2(f), of the signals s1(t) and s2(t), centered around two relevant carriers $f_{c1}$ and $f_{c2}$ symmetrically arranged compared to the central frequency $f_0$.

Figure 5:

FIG. 5 shows a spectral representation Z2(f) of the demodulated signal z2(t), or indifferently a spectral representation Z3(f) of the demodulated signal z3(t), where the two spectrum S1(f) and S2(f) of FIG. 4 can be noticed, shifted in base band BW/2, centered around a common frequency $\Delta f$. The representation is purposely altered for demonstration purposes, actually the spectrum in base band is the sum of the two, as it can be shortly noticed.

In the operation, making reference to FIGS. 2, 4 and 5, and to what is already known on the analytical representation of phase modulated signals, it is possible to express the -signals. s1(t), s2(t) and z1'(t) as follows:

$$s1(t)=I1 \cos \omega_1 t - Q1 \sin \omega_1 t; \text{ where: } \omega_1=\omega_0-\Delta\omega, \text{ being } \Delta\omega=2\pi\Delta f$$

$$s2(t)=I2 \cos \omega_2 t - Q2 \sin \omega_2 t; \text{ where: } \omega_2=\omega_0+\Delta\omega.$$

The signal at the input of the demodulator DEMI/Q is z1'(t)=s1(t)+s2(t). Assuming that the two branches of the demodulator DEMI/Q are perfectly balanced, at the output of the component in phase is $z2(t)=z1'(t)\cos \omega_0 t$ and at the output of the component in quadrature is $z3(t)=z1'(t)(-\sin\omega_0 t)$ which, neglecting the $2\omega_0$ frequency terms filtered by the PBAS filter, become:

$$z2(t)=½[(I1+I2) \cos \Delta\omega t+(Q1-Q2) \sin \Delta\omega t]$$

$$z3(t)=½[(Q1+Q2) \cos \Delta\omega t+(I2-I1) \sin \Delta\omega t]$$

These expressions justify the spectral representation of FIG. 5. The signals z2(t) e z3(t) are filtered by a low-pass filter (not visible in the figure) that eliminates the component at 2BW frequency, sampled at a sampling frequency fs=BW, converted to digital, and respectively sent to the demodulators DEM1 and DEM2. The numeric oscillator NCO, driving the pairs of numeric mixers of both the demodulators, has a frequency $\Delta f$. The four identical low pass filters FIR eliminate possible components due to adjacent channels from the demodulated signals. The signals z4(t), z5(t), z6(t) and z7(t) at the outputs of filters FIR have the following expressions:

$$z4(t)=z2 \cos \Delta\omega t=¼(I1+I2)$$

$$z5(t)=z2(-\sin \Delta\omega t)=¼(Q2-Q1)$$

$$z6(t)=z3 \cos \Delta\omega t = \frac{1}{4}(Q1+Q2)$$

$$z7(t)=z3(-\sin \Delta\omega t) = \frac{1}{4}(I1-I2)$$

forming a linear system of four equations in the four unknown values I1, Q1, I2, Q2. The sum network RSOM solves this system and gives the numeric values of the components I1, Q1 and I2, Q2 of the demodulated carriers relevant to channels CH1 and CH2 through the following expressions:

$$I1=2(z4+z7)$$

$$Q1=2(z6-z5)$$

$$I2=2(z4-z7)$$

$$Q2=2(z6+z5)$$

Should one of the two channels not be present, the above mentioned solution would still be valid for the remaining channel, since the four equations of the system would no more result independently, being that the two following relations: $z4(t)=z7(t)$ e $z6(t)=-z5(t)$, in this case two, out of the four equations could be eliminated.

The illustration supplied for the receiver of the embodiment of FIG. 2 justifies the advantages ascribed to a receiver according to the present invention. In particular, the radiofrequency band pass filter PBAND can have a greatly lower selective response in frequency than that of a similar one usually employed for the suppression of the image band. In fact, in the receiver of FIG. 2, the image band consists of channels belonging to the upper half band versus the frequency of local oscillator, channels that are also shifted by the demodulator directly in the lower half band of the base band, and from there discriminated through a second demodulation in quadrature and a numeric processing on the demodulated signals. Therefore, possible undesired components of the radiofrequency signal, that are transferred in base band through a broad radiofrequency filtering, do not disturb the receiver that much, because they are beyond the upper half base band.

Figure 3:
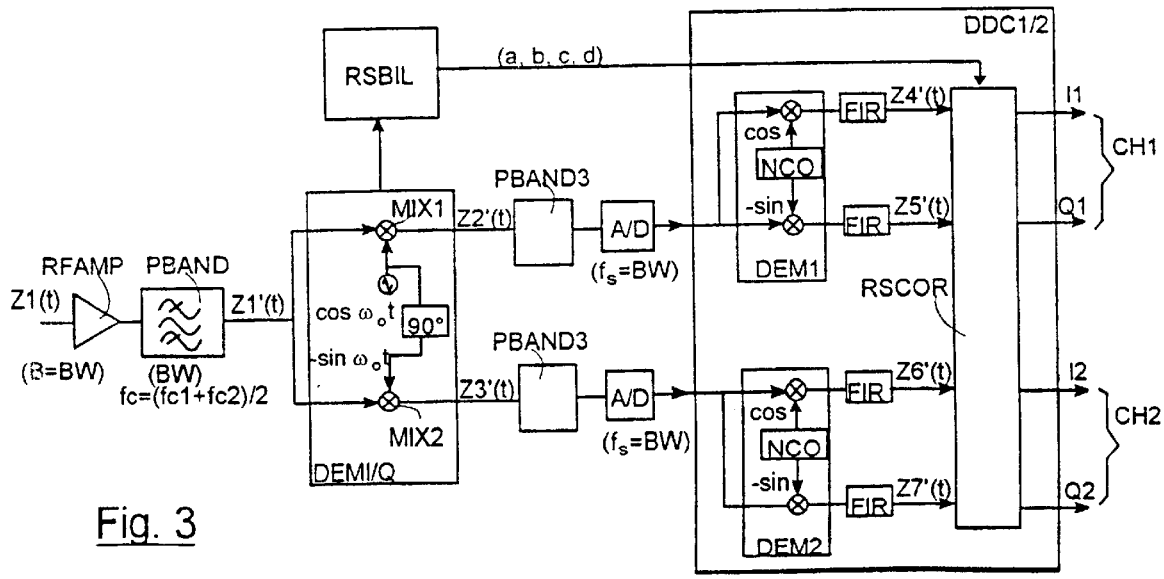
FIG. 3 shows an additional embodiment of the receiver of FIG. 2.

Making reference to FIG. 3, the circuit-related embodiment that enables the receiver of FIG. 2 to recover a possible dissymmetry between the two branches of the demodulator DEMI/Q is examined for the purpose of a correct demodulation. The receivers of FIGS. 2 and 3 differ only due to the fact that in the receiver of FIG. 3:

a) an additional RSBIL block is present;
b) the two low-pass filters PBAS of FIG. 2 are now two band pass filters PBAND3 that, as will be seen, differ from PBAS due to the fact to suppress from the spectrum of the signal in base band the components around the null frequency; and
c) that the block RSOM of FIG. 2 is called RSCOR, which means that this is a different operation mode.

In operation, the block RSBIL receives the information from DEMI/Q and communicates in its turn information to RSCOR. This, representation is in line with the object of the embodiment, which intends to introduce in the receiver a circuit measuring the above mentioned dissymmetries, in particular the RSBIL block, and a network capable to counterbalance the same, through the use of the reconstruction network RSCOR. This last feature is obtained by appropriately modifying the sum network RSOM shown in FIG. 2. The following considerations will be helpful to clarify the operation of the RSBIL and RSCOR blocks, whose detailed representation is given in FIGS. 8 and 9. From the physical point of view, the cause for dissymmetries can be ascribed to some difference in the two analog mixers MIX1 and MIX2 of the demodulator DEMI/Q; which relate to those of the two relevant in quadrature components in the expressions of the voltage z2(t) and z3(t) coming out from DEMI/Q of FIG. 2. These new components unbalance the inputs of the reconstruction network RSOM and invalidate the operations made by the same. In the following analytical description, two parameters k1 and k2 are introduced to indicate the amplitude unbalancing of the signals between the two branches of the demodulator, and other two ones $\epsilon_1$, $\epsilon_2$ to indicate the phase unbalancing. It is also convenient to assume the following positions:

$$a = \frac{1}{2} k1 \cos \epsilon_1$$

$$b = -\frac{1}{2} k1 \sin \epsilon_1$$

$$c = \frac{1}{2} k2 \sin \epsilon_2$$

$$d = \frac{1}{2} k2 \cos \epsilon_2$$

It can be easily demonstrated that in presence of dissymmetries the expressions of z2(t) and z3(t) transform into the following expressions, indicated with z2'(t) and z3'(t) in FIG. 3:

$$\begin{aligned} z2'(t) &= \tfrac{1}{2}k1\{\cos\epsilon_1[(I1+I2)\cos\Delta\omega t + (Q1-Q2)\sin\Delta\omega t] \\ &\quad - \sin\epsilon_1[(Q1+Q2)\cos\Delta\omega t + (I2-I1)\sin\Delta\omega t]\} \\ &= 2az2(t) + 2bz3(t) \\ z3'(t) &= \tfrac{1}{2}k2\{\cos\epsilon_2[(Q1+Q2)\cos\Delta\omega t + (I2-I1)\sin\Delta\omega t] \\ &\quad + \sin\epsilon_2[(I1+I2)\cos\Delta\omega t + (Q1-Q2)\sin\Delta\omega t]\} \\ &= 2dz3(t) + 2cz2(t) \end{aligned}$$

From which, as re-test, z2(t) and z3(t) can be newly obtained as in the particular case of absence of unbalancing, that is for k1=k2=1 and $\epsilon_1=\epsilon_2=0$. The signals z2'(t) and z3'(t) reach the inputs of DEM1 and DEM2 respectively, at the outputs of which we have two relevant pairs of signals z4'(t), z5'(t) and z6'(t), z7'(t).

The expressions of these new signals are the following:

z4'(t)=z2'(t) cos $\Delta\omega$t=[2az2(t)+2bz3(t)]cos $\Delta\omega$t=a/2(I1+I2)+b/2(Q1+Q2)

z5'(t)=z2'(t) (-sin $\Delta\omega$t)=[2az2(t)+2bz3(t)](-sin $\Delta\omega$t)=a/2(Q2-Q1)+b/2(I1-I2)

z6'(t)=z3'(t) cos $\Delta\omega$t=[2dz3(t)+2cz2(t)]cos $\Delta\omega$t=d/2(Q1+Q2)+c/2(I1+I2)

z7'(t)=z3'(t) (-sin $\Delta\omega$t)=[2dz3(t)+2cz2(t)](-sin $\Delta\omega$t)=d/2(I1-I2)+c/2(Q2-Q1)

forming a linear system of four equations in the four unknown values I1, Q1, I2, Q2. The reconstruction network RSCOR receives at input the values z4'(L), z5'(t), z6'(t), z7'(t) and coefficients a, b, c, d, which appear as correction terms, solves this problem and supplies the numeric values of the components I1, Q1 and Q2, Q2 of the demodulated carriers relevant to channels CH1 and CH2 through the following expressions:

$$I1 = \frac{d \cdot z4' - c \cdot z5' - b \cdot z6' + a \cdot z7'}{ad - bc}$$

$$Q1 = \frac{-c \cdot z4' - d \cdot z5' - a \cdot z6' + a \cdot z7'}{ad - bc}$$

-continued $$I2 = \frac{d \cdot z4 + c \cdot z5 - b \cdot z6 + a \cdot z7}{ad - bc}$$

$$Q2 = \frac{-c \cdot z4 + d \cdot z5 + a \cdot z6 - b \cdot z7}{ad - bc}$$

The expressions solving the systems are more complex than the similar expressions relevant to the receiver of FIG. 2; this is in line with the scope of the embodiment of FIG. 3 that has the purpose to eliminate the imperfection of the analog demodulator through a correction in the digital domain. It must be pointed out that the solutions exist only if the determinant of the system ad−bc placed at denominator does not become null, as it occurs for $\epsilon_1 = \epsilon_2 = 45°$, being this situation very unlikely in practice due to the high dissymmetry value. Should particular relations exist between the in phase (I) and in quadrature (Q) components, the expressions solving the system can be simplified.

Such an approach is absolutely necessary in presence of multicarrier signals for channels subject to a wide level dynamic, such as for instance the signals used in mobile communication systems. In lack of correction, in fact, a low level channel could be blind by a fraction k of the image signal that superimposes to the useful signal, attenuated by 20 or 30 dB. This phenomenon is due to imperfections in real quadrature analog demodulators.

Figure 7:
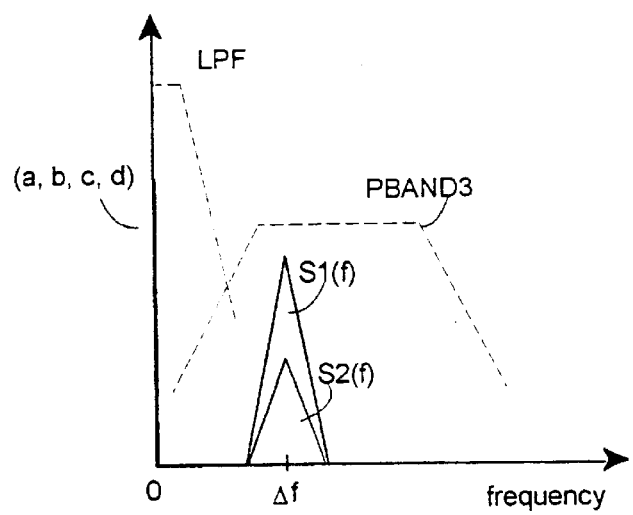
Figure 8:
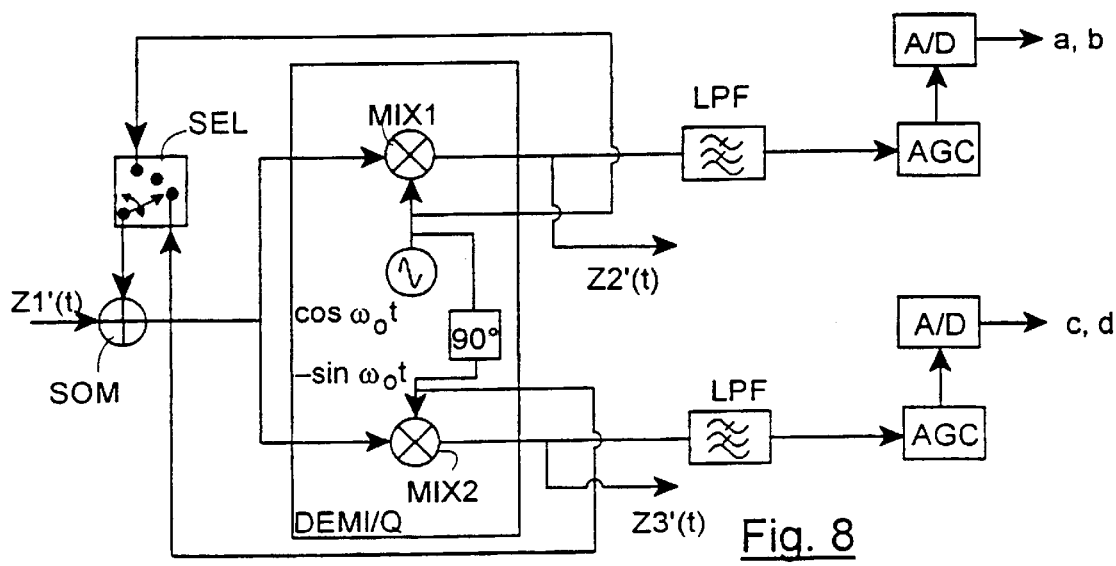
FIG. 8 shows a DEMI/Q block shown in FIG. 3 and the circuit included in a RSBIL (a network in the receiver measuring the amplitude and phase dissemtries in the two branches of the analog demodulator and supplying for correspondence digital coefficients to the reconstruction network (RSCOR) which is thus able to counterbalance at output the effect due to dissymemetries) block of the same figure.

Referring to FIG. 8, the RSBIL network for the calculation of coefficients a, b, c, d is shown. The network, represented with a sole block in FIG. 3, is here more realistically shown in a circuit-related detail that articulates around the demodulator DEMI/Q. The RSBIL network includes a two-input adder SOM, a three-position selector SEL, two identical low-pass filters LPF, two identical AGC blocks for the automatic gain control, and finally two identical A/D blocks for the analog/digital conversion. The radiofrequency signal z1'(t) reaches a first input of the adder SOM, whose second input is connected to the mobile cursor of SEL. The output of the adder SOM is connected to the inputs of the demodulator. The central position of the selector SEL is free from connections, while the two selection positions are connected to relevant inputs driving the two mixers MIX1 and MIX2 inside the block DEMI/Q. Therefore in these positions, the local oscillator signals cos $\omega_0 t$ and −sin $\omega_0 t$, respectively, will be selected. The phase output of DEMI/Q is subdivided into two branches, a first branch is connected to the input of a cascade of blocks consisting of a first low-pass filter LPF, a first AGC and a first A/D converter, whose output gives the coefficients a, b. The second branch of the in phase output of DEMI/Q which corresponds to the branch in phase coming out from DEMI/Q, shown in FIG. 3. The quadrature output of DEMI/Q is also subdivided into two branches, a first branch is connected to the input of a cascade of blocks formed by the second low-pass filter LPF, the second AGC and tile second A/D converter, whose output gives the coefficients c, d. The second branch of the output in quadrature of DEMI/Q corresponds to the branch in quadrature coming out from DEMI/Q, shown in FIG. 3. The operation of the network RSBIL is now illustrated with the aid of FIGS. 6 and 7.

Figure 6:
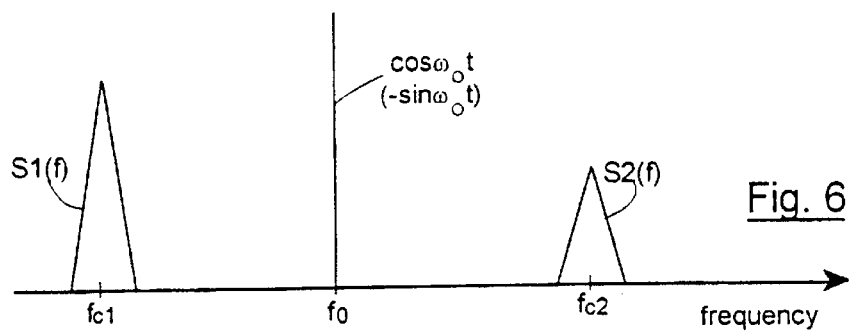
FIGS. 6 and 7 show the spectrum of the waveforms relevant to the operation of the receiver according to the embodiment shown in FIG. 3.

FIG. 6 shows the spectrum S1(f) and S2(f) of FIG. 4 with the local oscillator tone at the center, in the two forms cos $\omega_0 t$ or −sin $\omega_0 t$, respectively.

FIG. 7 shows the representation in base band of FIG. 5, after demodulation, including also a null frequency line, obtained from the output of MIX1 and MIX2, due to the beating of the signal of local oscillator, with itself or with its form in quadrature.

Concerning the operation of the RSBIL network, when the cursor of SEL is turned on the position carrying the signal cos $\omega_0 t$ to the second input of the adder SOM, the correction values a, c appear at output from the A/D converters; on the contrary, when −sin$\omega_0 t$ is selected, the correction values b, d appear. It can be noticed that the selector SEL enables to use the signal of local oscillator as sample signal for the measurement of the dissymmetry existing on the two branches of the analog demodulator DEMI/Q, and also that this measure, and consequently the updating of the correction factors a, b, c, d, are completely independent from the normal operation of the receiver. In fact, the adder SOM enables the input signal z1'(t) to reach the demodulator DEMI/Q even in presence of the test tone that, as shown in FIG. 7, does not disturb the demodulated channels, since it is not allocated in the band of the channels. Furthermore, once the updating is completed the cursor can be switched to the central high impedance position, the new correction values will remain stored in memory registers of the RSCOR network, not shown in FIG. 9. Of particular importance for the correct operation of the RSCOR network is the fact that the feedback of the signals of local oscillator on the input of the demodulator DEMI/Q does not introduce itself a significant phase and amplitude distortion in respect with that one intends to correct. A means to reduce the effects of this possibility, could be that to evaluate the unbalancing in absence of the input signal z1(t), not to overload the two mixers. Essential importance has also the accuracy in the evaluation of the correction parameters a, b, c, d, because the correspondence degree of the components I1, Q1, I2, Q2 to the values transmitted depends on the same. To this purpose, two A/D converters must be employed, having enhanced level dynamic; the AGC placed upstream from the A/D help to better exploit the dynamic, since they compress the level dynamic of the signal almost constant coming out from the low-pass filters LPF within a value interval more suitable to the good operation of the A/D. FIG. 7 shows the total spectrum of the demodulated signal z2'(t), or z3'(t), in presence of the test tone. It can also be noticed the masks of filters LPF and PBAND3, which select from the total spectrum the values that will become the coefficients a, b, c, d, and the signals that will become the components I1, Q1, I2, Q2. The generic block A/D necessarily includes a sampler of the signal coming from the AGC. The sampling frequency can be selected with very low value, around 100 Hz, since the null frequency line is in reality an almost constant signal with a band lower than 50 Hz. Once the correction factors are obtained and neglecting the effects of the thermal drift, their values can remain unchanged for a long time, since the physical characteristics of the mixers slowly modify during the life cycle of the receiver, mainly due to ageing phenomena. In any case if the characteristics of the demodulated signal deteriorate, it is convenient to recalculate the correction factors. Considering also the thermal drift, it is necessary to prepare the RSBIL network for an automatic and repetitive operation; to this purpose the selector SEL must be electronically controlled to switch between the two selection positions in a cyclic way and with a set period.

Figure 9:
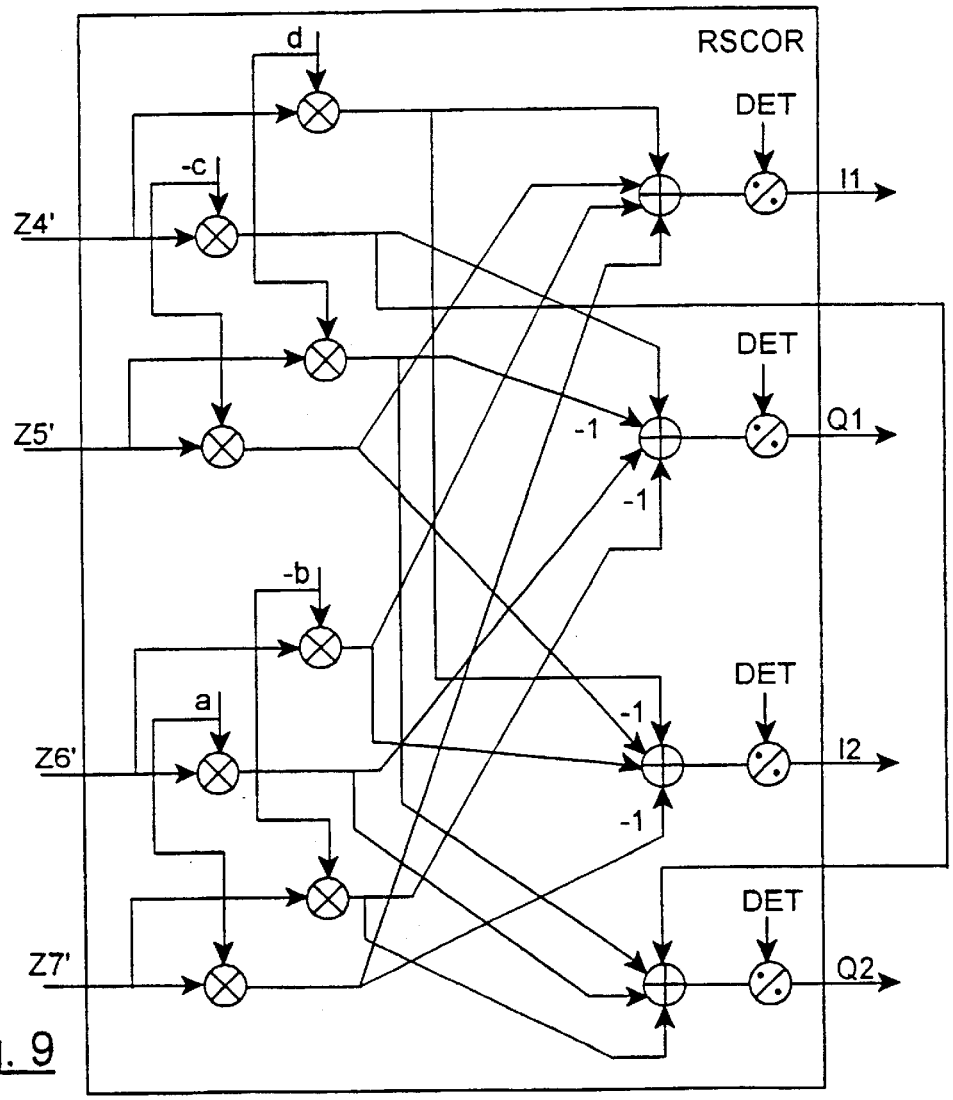
FIG. 9 shows the circuit included in a RSCOR (reconstruction network) block of FIG. 3.

Making reference to FIG. 9, it can be noticed in detail the circuit forming the reconstruction network RSCOR. The configuration of such a circuit is the simple transposition in hardware of the expressions that solve the equation system previously indicated, keeping in mind that it is a digital hardware. In particular, we see that the network includes: 8 multipliers, 4 adders, 4 dividers of the numerator coming out for the adders for the determinant DET=(ad−bc), as well as 6 inverters. For the calculation of the determinant DET, 2 multipliers and 1 inverter are also required. Finally, four memory registers are required for coefficients a, b, c, d.

Figure 10:
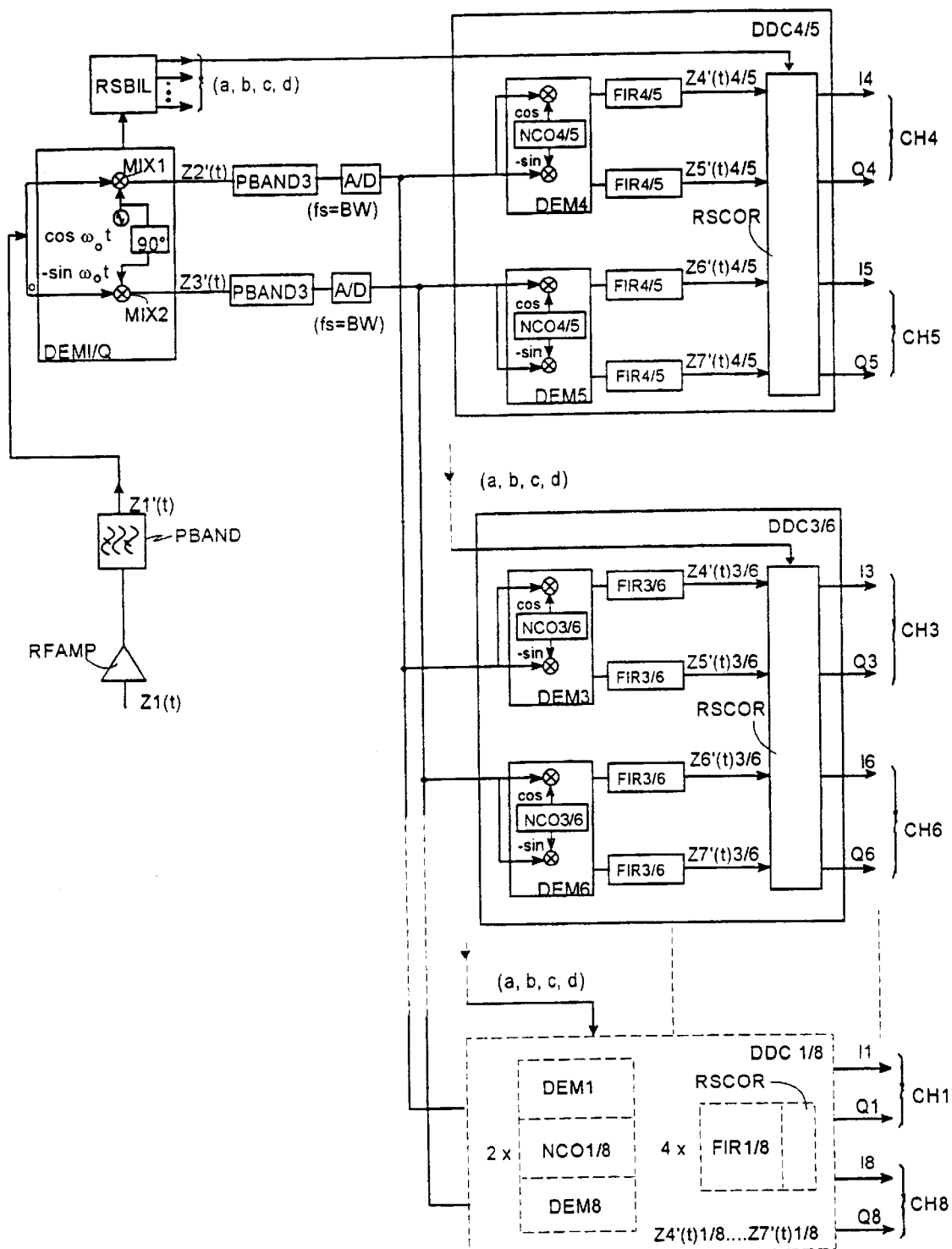
FIG. 10 shows a block diagram of the radio receiver according to the additional embodiment of the present invention, for the more general case of N carriers.

Referring to FIG. 10, a radioreceiver is now described more generally than the simplified one for two sole carriers, shown in FIG. 3. As an indication, it has been selected a number of eight modulated carriers have been selected, representing eight communication channels. The spectral representations of FIGS. 11, 12, 13 and 14 will be helpful in the description of the receiver. Comparing the receivers of FIGS. 3 and 10, the following differences can be noticed for the receiver of FIG. 10:

A) there are four DDCx/y blocks having the same structure as block DDC1/2 in FIG. 3, namely: DDC4/5, DDC3/6, DDC2/7, DDC1/8 which are relevant to pairs of channels CH4/CH5, CH3/CH6, CH2/CH7 and CH1/CH8 so that the result is symmetric versus the frequency of local oscillator, indicated with $f_O$ in FIG. 11;

B) the numeric oscillators assume the same numbering FIRx/y of the DDCx/y block they belong to, namely: NCO4/5, NCO3/6, NCO2/7, NCO1/8 relating to DDC4/5, DDC3/6, DDC2/7, DDC1/8;

C) the low-pass filters upstream from the network RSCOR assume the same numbering of FIRx/y of the block DDCx/y they belong to, namely: FIR4/5, FIR3/6, FIR2/7, FIR1/8 corresponding to DDC4/5, DDC3/6, DDC2/7, DDC1/8;

D) the signals $z4'(t)$, $z5'(t)$, $z6'(t)$, $z7'(t)$ are now indicated with $z4'(t)_{x/y}$, $z5'(t)_{x/y}$, $z6'(t)_{x/y}$, $z7'(t)_{x/y}$ being specific to the block DDCx/y they belong to; and E) the RSBIL network now has as many outputs as the RSCOR networks and, therefore, is connected to the DDCx/y blocks.

Figure 11:
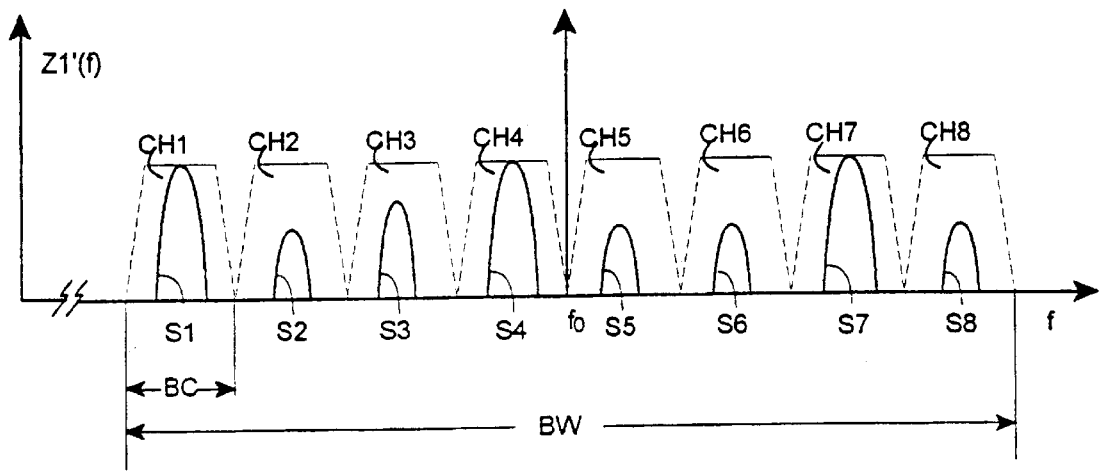
FIGS. 11 and 12 show the spectrum of the waveforms relevant to the operation of the receiver according to the embodiment of FIG. 10.

FIG. 11 shows the frequency spectrum $Z1'(f)$ of the entering multicarrier signal $z1(t)$ filtered by the PBAND filter, where 8 contiguous spectrum $S1(f), \ldots, S8(f)$, can be noticed, occupying a total band BW, relevant to a same number of communication channels CH1, ..., CH8, each of them occupying a band having BC (band of each communication channel CH1, ..., CH8 width. Whenever the receiver of FIG. 10 was employed in a GSM mobile system GSM, the eight channels CH1, ..., CH8 would actually correspond to 54 channels received, time-shared on 8 carriers selected among the 174 possible ones (number 8 is only a design choice). Should the receiver belong to a Base Transceiver Station (BTS) of an EGSM system (extended GSM), the radiofrequency band pass filter PBAND would have 35 MHz bandwidth, with slope capable to attenuate the transmission band 10 MHz far; being the distance between the upper limit of the reception band (880–915 MHz) used for the communications between the Mobiles (MS) and the Base Transceiver Station (BTS) and the lower limit of the transmission band. (925–960 MHz). Remaining in the example, when the receiver is employed in the BTS the frequency $f_O$ of local oscillator will be 897.5 MHz in order to subdivide the total band into two equal half bands. In any case the $f_O$ must be selected in order to symmetrically subdivide the N channels in the BW band. FIG. 11 shows the case with N pair, as it occurs in the EGSM where N=174, from which it can be noticed that the $f_O$ falls between the two central channels and subdivides the BW band into two groups of N/2 channels each, shifted, due to the demodulation, in the same lower half base band BW/2, as in FIG. 12. On the contrary, in the case of odd N, the $f_O$ is placed at the center of the distance separating the spectrum of frequencies of two central channels. The channel placed at one or at the other band limit that does have a mate joins the noise present in the position of the spectrum symmetrical to it, versus the frequency $f_O$.

Figure 12:
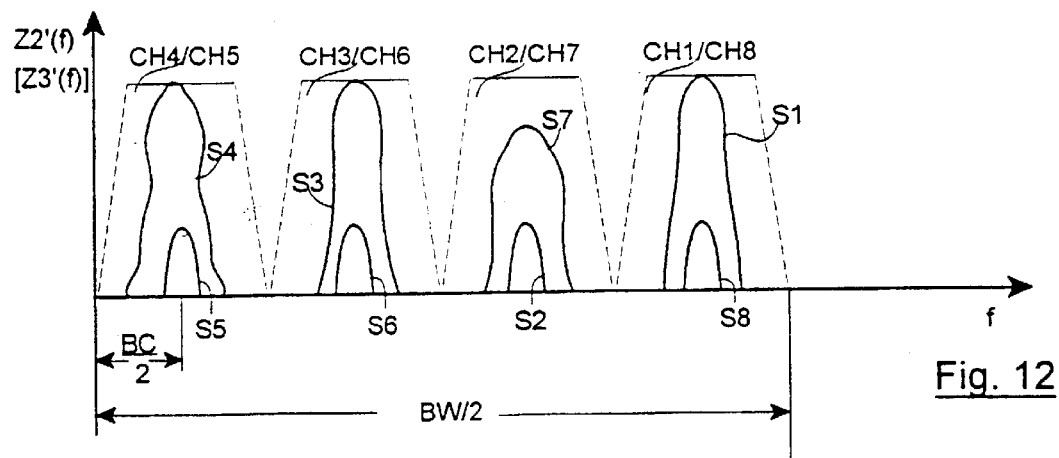

FIG. 12 shows the spectrum of frequencies $Z2'(f)$, or in equivalent manner $Z3'(f)$, of the signal $z2'(t)$, or $z3'(t)$, coming out from the demodulator DEMI/Q. As for FIG. 5, it can be noticed that, due to the particular choice of the frequency $f_O$ of local oscillator placed in the middle of the BW band, the radiofrequency signal is converted through direct demodulation within a base band having BW/2 width and the symmetric channels versus the frequency $f_O$ undergo a spectral superimposition. More in particular, the pairs of superimposed channels will be: CH4/CH5, CH3/CH6, CH2/CH7, CH1/CH8.

Demodulators DEMX and DEMy, relevant to each DDCx/y block, can correctly operate using two isofrequential carriers in phase quadrature supplied by the relevant pair of NCOx/y. These two isofrequential carriers have a frequency $fp_{x/y}$ equal to the band center one of the pairs of superimposed channels in the base band, that is:

$$fp_{x/y} = \frac{1}{2}PC, \frac{3}{2}PC, \ldots, \frac{7}{2}PC,$$

where PC indicates the channel spacing, irrespective of the fact that N is even or odd.

At the output of demodulators DEMX and DEMy, there will be some components at double frequencies $2fp_{x/y}$ that will be removed by the four identical filters FIRx/y; therefore, the filters will have a bandwidth within 0 and BC/2.

Inside the generic block DDCx/y, the signals $z4'(t)_{x/y}$, $z5'(t)_{x/y}$, $z6'(t)_{x/y}$, $z7'(t)_{x/y}$ will originate an equation system similar to that of the two-channel receiver of FIG. 3, and can be obtained from the same replacing the indexes 1, 2 by more generic ones x, y specified time by time.

The RSCOR networks are all identical, since they must correct the dissymmetries of the analog demodulator DEMI/Q which is unique for all the DDCx/y block. The receiver of FIG. 10 is suitable to a "dynamic" operation, that is with channels assigned in a dynamic way, just like it is required in the GSM, being sufficient to this purpose to change the value of the frequency $fp_{x/y}$ of a given block DDCx/y to receive a corresponding pair of channels. The numeric implementation of the blocks FIRx/y, NCOx/y, DEMx and DEMy will, therefore, support this dynamic characteristic, the methods according to which this is possible being known by those skilled in the art, in general the frequency change is sufficient.

Finally, the in phase and in quadrature components of the single channels must be sent to the demodulator GMSK to obtain again the bit flow of the transmission burst.

In the case where a symmetric mate versus the $f_O$ does not correspond to a given channel, since it is not comprised in the channel assigned to the receiver, no modification is made to the receiver architecture, because the signal of the missing symmetric channel is replaced by the noise present in this position of the spectrum.

As for the hardware implementation of the digital portion of the receiver, it can select the use of one or more mathematical microprocessors (DSP), or decide for the design of a dedicated integrated circuit (ASIC); this last possibility is the more suitable.

Therefore, while some embodiments of the present invention have been shown and described, it should be understood that it is not limited thereto, but extends to cover all other embodiments that may be clear to those skilled in the art without departing from the scope thereof. It is thus contemplated that the present invention encompasses any and all such embodiments covered by the following claims.

What is claimed is:

1. A method for the implementation of a broad band receiver for a signal (z1(t)) consisting of a plurality of equispaced carriers, orthogonally modulated by information conveyed by relevant channels (CH1, ..., CH8) in order to carry out a radiofrequency multicarrier signal; including a radiofrequency filtering with band pass (PBAND) characteristic for the suppression of signals not included in the band of the radiofrequency multicarrier signal and to achieve a radiofrequency filtered signal (z1'(t)), said method comprising in sequence the following steps:

a) direct demodulation (DEMI/Q) of the radiofrequency filtered signal (z1'(t)) by multiplication of said signal for two local phase quadrature carriers (cos $\omega_0 t$, -sin $\omega_0 t$) whose frequency corresponds to a central value of the radiofrequency multicarrier signal spectrum, obtaining a demodulated signal having a relevant spectrum in the lower half of the base band (BW) where pairs of channels (CH4, CH5; ...; CH1, CH8) in symmetric positions at the two sides of said local phase quadrature carriers are superimposed;

b) broad band filtering in base band of in phase (z2'(t)) and in quadrature (z3'(t) components that correspond to the demodulated signal, for the suppression of additional components outside an interest band;

c) sampling of the components broad band filtered in base band (z2'(t), (z3'(t)), making use of a sampling frequency equal to the bandwidth (BW) of said multicarrier signal, and subsequent analog-to-digital conversion (A/D) of the sampled components, obtaining first digital in phase and in quadrature components;

d) digital demodulation (DEM4, DEM5; ...; DEM1, DEM8) of said first digital components by multiplication for pairs of relevant phase quadrature sinusoidal digital signals, having frequency equal to the value of center band of pairs of channels (CH4, CH5; ...; CH1, CH8) previously superimposed at the step a), obtaining in coincidence with said pairs of phase quadrature sinusoidal digital signals, due to the multiplication, quartets of numeric values (z4(t)$_{4/5}$, z5(t)$_{4/5}$, z6(t)$_{4/5}$, z7(t)$_{4/5}$; ...; z4(t)$_{1/8}$, z5(t)$_{1/8}$, z6(t)$_{1/8}$, z7(t)$_{1/8}$) that can be analytically expressed through linear systems, each of four equations in four unknown values corresponding to amplitudes of second digital in phase (I4, I5; ...; I1, I8) and in quadrature (Q4, Q5; ...; Q1, Q8) components belonging to said quartets of numeric values;

e) solution of said linear systems (RSOM) obtaining said amplitudes of the second digital components (I4, Q4; I5, Q5; ...; I1, Q1; I8 Q8) with each single channel of said pairs of channels (CH4, CH5; ...; CH1, CH8), thus eliminating phase and amplitude dissymmetry in base band due to the superimposition of channels in the previous step a).

2. The method according to claim 1, wherein said linear systems have the following expression:

z4(t)$_{x/y}$=¼(Ix+Iy)

z5(t)$_{x/y}$=¼(Qy-Qx)

z6(t)$_{x/y}$=¼(Qx+Qy)

z7(t)$_{x/y}$=¼(Ix-Iy)

where: z4(t)$_{x/y}$, z5(t)$_{x/y}$, z6(t)$_{x/y}$, z7(t)$_{x/y}$ are said quartets of numeric values relevant to any pair of channels (CHx, CHy), and Ix, Qx, Iy, Qy are said unknown relevant amplitudes of the second digital components.

3. The method according to claim 1, wherein said broad band filtering in base band (PBAND3) of the demodulated signal is a band pass filtering that suppresses from the spectrum of the signal in base band the components around the null frequency.

4. The method according to claim 3, further including the additional steps of:

measuring the amplitude and phase dissymmetry degree on two branches of an analog demodulator (DEMI/Q) performing said direct demodulation from radiofrequency to base band;

introducing four correction factors (a, b, c, d), which depend on the measurement carried out in the preceding step, in said linear systems of equations, obtaining modified systems, still linear, having the same number of equations; and solving said modified systems (RSCOR) obtaining, in correspondence of said quartets of numeric values (z4'(t)$_{4/5}$, z5'(t)$_{4/5}$, z6'(t)$_{4/5}$, z7'(t)$_{4/5}$; ...; z4'(t)$_{1/8}$, z5'(t)$_{1/8}$, z6'(t)$_{1/8}$, z7'(t)$_{1/8}$) modified unknown amplitudes of the second digital in phase and in quadrature components, without unbalancing distortion, otherwise due to said dissymmetries on the two branches of said analog demodulator (DEMI/Q).

5. The method according to claim 4, wherein said additional steps for the measurement of the dissymmetry degree include the following sequential sub-steps:

feeding the input of the receiver with a first test tone corresponding to one in phase (cos $\omega_0 t$) of the two said local phase quadrature carriers (cos $\omega_0 t$, -sin $\omega_0 t$);

direct demodulating said first test tone from radiofrequency to base band by multiplication of the same by said two local phase quadrature carriers (cos $\omega_0 t$, -sin $\omega_0 t$), using said analog demodulator (DEMI/Q), obtaining two demodulated test signals (z2'(t), z3'(t)) in correspondence of the two branches (MIX1, MIX2) of the analog demodulator (DEMI/Q);

narrow band low-pass filtering (LPF) of the two demodulated test signals analog and conversion to digital (A/D), obtaining a first quasi-constant numeric value correspondent to a first correction factor (a) dependent on the overall dissymmetries on an in phase branch (MIX1), and a second quasi-constant numeric value correspondent to a second correction factor (c) dependent on the overall dissymmetries on an in quadrature branch (MIX2);

replacing the first test tone (cos $\omega_0 t$) at the input of the receiver with a second test tone corresponding to one in quadrature (-sin $\omega_0 t$) of the two said local phase quadrature carriers (cos $\omega_0 t$, -sin $\omega_0 t$); and repeating the direct demodulation sub-step;

narrow band low-pass filtering (LPF) of the two demodulated test signals (z2'(t), z3'(t)) and conversion to digital (A/D) obtaining a third quasi-constant numeric value correspondent to a third correction factors (b) dependent on the overall dissymmetries on the in phase branch (MIX1) and a fourth quasi-constant numeric value correspondent to a fourth correction factors (d) dependent on the overall dissymmetries on the in quadrature branch (MIX2).

6. The method according to claim 5, wherein said first test tone (cos $\omega_0 t$), or the second test tone (-sin $\omega_0 t$), are summed up (SOM) to said radiofrequency filtered signal (z1'(t)).

7. The method according to claim 6, wherein said substeps are indefinitely repeated.

8. The method according to claim 5 wherein said modified systems have the following generic expression:

$$z4'(t)_{x/y} = a/2(Ix+Iy) + b/2(Qx+Qy)$$

$$z5'(t)_{x/y} = a/2(Qy-Qx) + b/2(Ix-Iy)$$

$$z6'(t)_{x/y} = d/2(Qx+Qy) + c/2(Ix+Iy)$$

$$z7'(t)_{x/y} = d/2(Ix-Iy) + c/2(Qy-Qx)$$

where:

$z4'(t)_{x/y}$, $z5'(t)_{x/y}$, $z6'(t)_{x/y}$, $z7'(t)_{x/y}$ are said quartets of numeric values relevant to any pair of channels (CHx, CHy); Ix, Qx, Iy, Qy are said relevant modified unknown amplitudes of the second digital components; and a, b, c, d are said correction factors.

9. The method according to claim 1, wherein:

the number of said modulated equispaced carriers is odd;

said local phase quadrature ($\cos\omega_0 t$, $-\sin\omega_0 t$) carriers are placed midway two central modulated carriers; and the lowest, or the highest, modulated carrier of said plurality joins the noise present in the symmetric channel band with respect to said local phase quadrature ($\cos\omega_0 t$, $-\sin\omega_0 t$) carriers.

10. The method according to claim 1, wherein one or more of the modulated carriers are not present in said plurality.

11. A broad band receiver for a signal (z1(t)) consisting of a plurality of equispaced carriers, orthogonally modulated by information conveyed by relevant channels (CH1, ..., CH8) in order to carry out a radiofrequency multicarrier signal, including a radiofrequency filter with characteristic band pass (PBAND) for the suppression of signals not included in the band of said radiofrequency multicarrier signal and to achieve a radiofrequency filtered signal (z1'(t)), said receiver comprising:

first direct demodulation means of the radiofrequency filtered signal (z1'(t)), multiplying said signal for two local phase quadrature carriers ($\cos\omega_0 t$, $-\sin\omega_0 t$) whose frequency corresponds to a central value of the radiofrequency multicarrier signal spectrum, obtaining a demodulated signal having a relevant spectrum in the lower half of the base band (BW) where pairs of channels (CH4, CH5; ...; CH1, CH8) in symmetric positions at the two sides of said local phase quadrature carriers are superimposed;

broad band filtering means acting in base band for the filtering of components in phase (z2'(t)) and in quadrature (z3'(t)) that correspond to the demodulated signal, for the suppression of additional components outside an interest band;

sampling and analog-to-digital conversion means analog operated by a sampling frequency equal to the bandwidth (BW) of said multicarrier signal, for sampling the components broad band filtered in base band (z2'(t), z3'(t)) and obtaining first digital components in phase and in quadrature;

digital demodulation means (DEM4, DEM5; ...; DEM1, DEM8) placed downstream said analog-to-digital conversion means, controlled by pairs of relevant phase quadrature sinusoidal digital signals, having frequency equal to the value of center band of the pairs of channels (CH4, CH5; ...; CH1, CH8) superimposed in base band, said digital demodulation means obtaining, in coincidence with said pairs of phase quadrature sinusoidal digital signals*, quartets of numeric values ($z4'(t)_{4/5}$, $z5'(t)_{4/5}$, $z6'(t)_{4/5}$, $z7'(t)_{4/5}$; ...; $z4'(t)_{1/8}$, $z5'(t)_{1/8}$, $z6'(t)_{1/8}$, $z7'(t)_{1/8}$) that can be analytically expressed through linear systems, each of four equations in four unknown values, corresponding to amplitudes of second digital in phase (I4, I5; ...; I1, I8) and in quadrature (Q4, Q5; ...; Q1, Q8) components belonging to said quartets of numeric values; and solution means of said linear systems (RSOM), obtaining the above mentioned amplitudes of the second digital components (I4, Q4; I5, Q5; ...; I1, Q1; I8 Q8) for each single channel of said pairs of channel, thus eliminating phase and amplitude dissymmetry due to the superimposition of channels in base band.

12. The receiver according to claim 11, wherein said broad band filtering means acting in base band are band pass filters that suppress from the spectrum of the signal in base band the components around the null frequency.

13. The receiver according to claim 12, further including:

measurement means (RSBIL) of the amplitude and phase dissymmetry degree on two branches of an analog demodulator (DEMI/Q) belonging to said direct demodulation means; the measured dissymmetries corresponding to four correction factors (a, b, c, d); and alternative means (RSCOR) for the solution of said linear systems through linear combinations of said correction factors (a, b, c, d) with said quartets of numeric values ($z4(t)_{4/5}$, $z5(t)_{4/5}$, $z6(t)_{4/5}$, $z7(t)_{4/5}$; ...; $z4(t)_{1/8}$, $z5(t)_{1/8}$, $z6(t)_{1/8}$, $z7(t)_{1/8}$), obtaining said amplitudes of second digital in phase (I4, I5; ...; I1, I8) and in quadrature (Q4, Q5; ...; Q1, Q8) components of the channels of said pairs (CH4, CH5; ...; CH1, CH8), free from unbalancing distortion otherwise due to said dissymmetries on the two branches of said analog demodulator (DEMI/Q).

14. The receiver according to claim 13, wherein said measurement means of the dissymmetry degree (RSBIL) further includes:

a selector (SEL) switching to the input of the receiver either one or the other of two test tones corresponding to said local carrier in phase ($\cos\omega_0 t$), or in quadrature ($-\sin\omega_0 t$);

a first narrow-band low-pass filter (LPF), with an analog-to-digital converter in cascade, that supplies either one or the other of two correction factors (a, b) relevant to an in phase branch (MIX1) of said analog demodulator (DEMI/Q); and a second narrow-band low-pass filter (LPF), with an analog-to-digital converter in cascade, that supplies either one or the other of two correction factors (c, d) relevant to an in quadrature branch (MIX2) of said analog demodulator (DEMI/Q).

15. The receiver according to claim 14, wherein said means for the measurement of the dissymmetry degree (RSBIL) also includes a two-input adder (SOM) adding either one or the other of the two test tones ($\cos\omega_0 t$, $-\sin\omega_0 t$) to the multicarrier signal received and filtered at radiofrequency (z1'(t)), giving a sum signal for the input of the receiver.

16. The receiver according to claim 14, wherein said selector (SEL) is electronically controlled for alternatively and indefinitely select either one or the other test tone.

* * * * *